United States Patent [19]

Nakagaki

[11] Patent Number: 5,631,708

[45] Date of Patent: May 20, 1997

[54] AUTOMATIC PHASE CONTROL APPARATUS

[75] Inventor: Hirofumi Nakagaki, Neyagawa, Japan

[73] Assignee: Matsushita Electric Industrial Co., Ltd., Osaka, Japan

[21] Appl. No.: 304,882

[22] Filed: Sep. 13, 1994

[30] Foreign Application Priority Data

Sep. 13, 1993 [JP] Japan .................................. 5-226958

[51] Int. Cl.[6] .................................................. H04N 1/83
[52] U.S. Cl. .......................... 348/500; 348/556; 348/540
[58] Field of Search ............................... 348/500, 536, 348/539, 540, 708, 713, 544, 453, 506; 358/320, 327; H04N 9/83, 9/87

[56] References Cited

U.S. PATENT DOCUMENTS

| 4,000,476 | 12/1976 | Walker et al. | 331/17 |
| 4,769,691 | 9/1988 | Dischert | 358/19 |
| 4,807,048 | 2/1989 | Yasuda | 358/320 |

FOREIGN PATENT DOCUMENTS

| 0546440 | 6/1993 | European Pat. Off. . | |
| 0557856 | 9/1993 | European Pat. Off. . | |
| 40219396 | 8/1990 | Japan | H04N 9/87 |
| 3-65893 | 3/1991 | Japan . | |

OTHER PUBLICATIONS

EPO Search Report (94114338.0) dated Aug. 17, 1995.

Primary Examiner—Safet Metjahic
Assistant Examiner—Nina M. West
Attorney, Agent, or Firm—Ratner & Prestia

[57] ABSTRACT

An automatic phase control apparatus for controlling the frequency of a sine wave produced from a variable frequency oscillator to be equal to that of the carrier wave of the extracted chrominance signal. A phase difference detector 4 detects a phase difference between the sine wave and the carrier wave. The detected phase difference is integrated to obtain an integrated value which is applied to the frequency oscillator for determining the oscillation frequency. A deviation detector is provided for detecting a deviation of the integrated value with respect to an expected frequency control data calculated by a calculator. When the deviation is greater than a predetermined range, the integrated value is replaced with the calculated data.

8 Claims, 5 Drawing Sheets

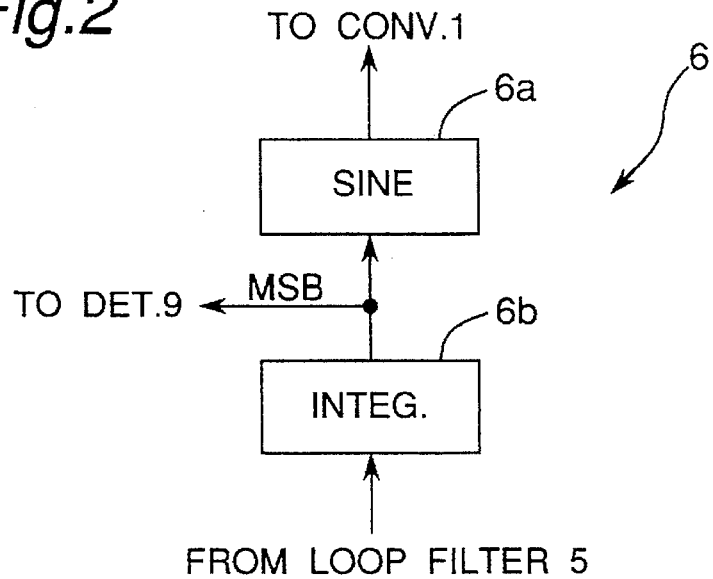
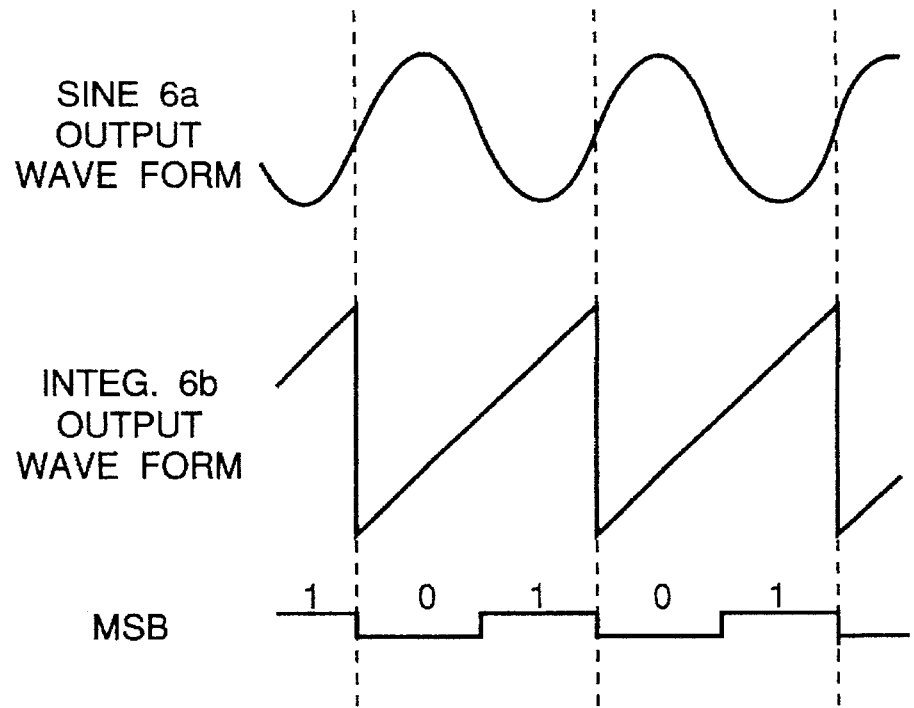

Fig.4A  S1
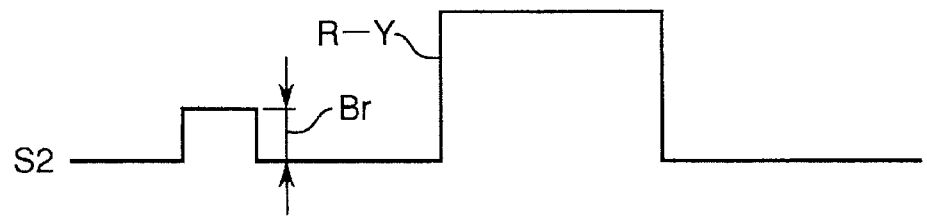
Fig.4B  S2
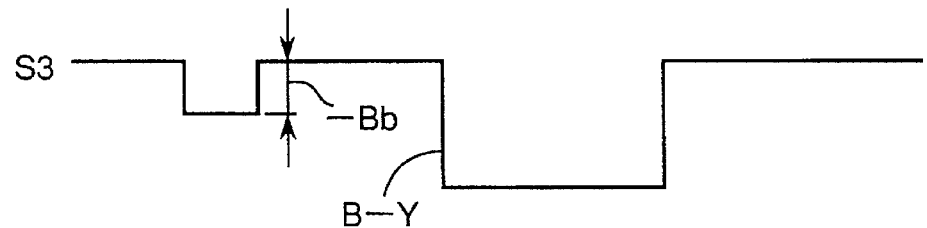
Fig.4C  S3
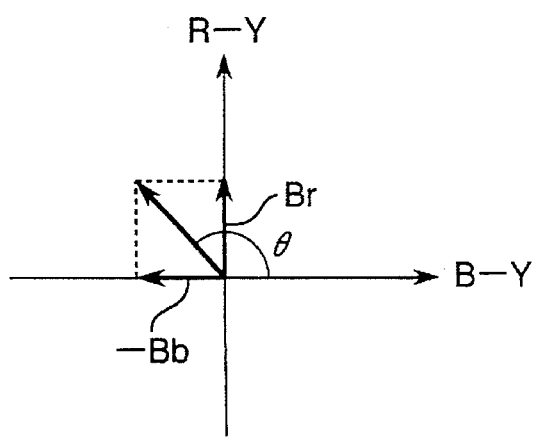
Fig.5

AUTOMATIC PHASE CONTROL APPARATUS

BACKGROUND OF THE INVENTION

1. Field of the Invention

The present invention relates to an automatic phase control apparatus used for chrominance signal frequency conversion processing in a consumer video cassette recorder (VCR) having a color video signal reproduction function.

2. Description of the Prior Art

Chrominance signal processing in consumer VCRs frequency converts the chrominance signal to a low band signal for recording, and then frequency converts the chrominance signal again during reproduction. The carrier frequency of the low-band converted chrominance signal in VHS-format VCRs is forty times the horizontal scanning frequency in the NTSC system, and 40.125 times the horizontal scanning frequency in the PAL system. Reproduction processing of the low-band converted chrominance signal is executed by an automatic phase control loop ("APC loop" below) generating an oscillation signal of which the frequency and phase are synchronized to the carrier wave of the reproduced low-band converted chrominance signal. One known problem with this APC loop is called "side lock," a phenomenon in which, because the burst signal is an intermittent signal, the APC loop locks even though the APC loop is a frequency that differs by an integer multiple of the horizontal scanning frequency from the carrier frequency of the reproduced low-band converted chrominance signal.

A conventional automatic phase control apparatus is disclosed in Japanese patent laid-open publication number 3-65893, published May 20, 1991. In this apparatus, the continuous wave of the variable frequency oscillator in the APC loop is phase-compared with the continuous wave of the carrier wave in the reproduced low-band converted chrominance signal obtained from the automatic frequency control loop ("AFC loop" below) to detect whether the APC loop has side locked, and if so whether the oscillation frequency of the variable frequency oscillator has Bide locked on the high frequency side relative to the carrier frequency of the reproduced low-band converted chrominance signal, or on the low frequency side. An "increase frequency" or "decrease frequency" signal is then input to the variable frequency oscillator to correct the APC loop from the side locked frequency to the correct frequency synchronization state.

The above method, however, requires an AFC loop circuit for side lock detection, thus increasing the complexity of the circuitry. The side lock correction circuit further comprises a loop consisting of a variable frequency oscillator, phase comparator, and frequency asynchronous detector, and further processing time is required for the loop to be corrected from the side locked state to the normal synchronization state.

Another problem with the APC loop is that when the carrier frequency of the reproduced low-band converted chrominance signal changes rapidly and suddenly during special video playback modes, the APC loop becomes offset from the synchronization state, and the chrominance signal is not reproduced normally until synchronization is restored (i.e., during the transient asynchronization state of the synchronization process). This synchronization process broadly consists of a frequency synchronization process and a phase synchronization process, and the time required to re-synchronize differs according to the transient response characteristics, which are determined by the natural frequency and damping factor of the APC loop. It is also known that if the natural frequency and damping factor of the APC loop are changed to improve the transient response characteristics, the steady characteristics of the synchronization state, including noise characteristics and jitter characteristics, deteriorate.

SUMMARY OF THE INVENTION

Therefore, an object of the present invention is to provide an automatic phase control apparatus which, by a relatively simple circuit configuration not using an automatic frequency control loop, is able to detect the frequency synchronization process and such operating errors as side locking in the automatic phase control loop; immediately correct the synchronization frequency; and improve transient characteristics without deteriorating the steady characteristics of the APC loop.

To achieve this object, an automatic phase control apparatus according to the present invention comprises: a horizontal sync separator for producing a horizontal sync signal separated from a reproduced luminance signal; an automatic phase control loop of which a closed loop transfer function takes a secondary loop form, and which comprises, a variable frequency oscillator and a loop filter comprising an integrating means; calculation means for calculating an expected value that would be produced from said integrating means using a unit period determined by said horizontal sync signal; and detection means for detecting the frequency synchronization state of the automatic phase control loop, said calculated value being input to said integration means when said detected frequency synchronization state is out of a predetermined range.

According to the preferred embodiment of the present invention, an automatic phase control apparatus comprises: chrominance signal producer for extracting chrominance signal from a playback video signal and for producing a chrominance signal modulated with a carrier signal; variable frequency oscillator means for producing a wave signal having a frequency determined by an input frequency control data; calculation means for calculating an expected frequency control data; frequency converter means for demodulating the chrominance signal to remove the carrier signal by the use of said wave signal; phase difference detection means for detecting a phase difference between said wave signal and said carrier signal; deviation detection means for detecting a deviation of said frequency control data with respect to said expected frequency control data; frequency control data generating means for generating a frequency control data in accordance with said detected phase difference when said deviation is less than a predetermined amount, and in accordance with said expected frequency control data when said deviation is greater than said predetermined amount.

By this configuration, an automatic phase control apparatus of the invention calculates the value equivalent to the expected output of the integrating means of the APC loop from the period of the H sync pulse separated from the reproduced luminance signal, and immediately restores the APC loop to the frequency-synchronized state by setting this calculated value as the output of the integrating means according to the frequency synchronization state of the APC loop detected from the oscillation count of the variable frequency oscillator it is therefore possible by a relatively simple circuitry not using an AFC loop to detect and correct frequency asynchronization states and misoperation, including side locking, of the APC loop. By completing this correction operation instantaneously, the transient characteristics of the APC loop can also be improved.

BRIEF DESCRIPTION OF THE DRAWINGS

The present invention will become more fully understood from the detailed description given below and the accompanying diagrams wherein:

FIG. 2 is a block diagram showing a detail of a variable frequency oscillator shown in FIG. 1;

FIGS. 3A, 3B and 3C are wave form diagrams of the output wave of the variable frequency oscillator 6 shown in FIG. 2;

FIGS. 4A, 4B and 4C are wave form diagrams of various signals obtained from the circuit of FIG. 1;

FIG. 5 is a vector diagram particularly showing a phase θ of a detected burst signal;

DESCRIPTION OF PREFERRED EMBODIMENTS

Figure 1:
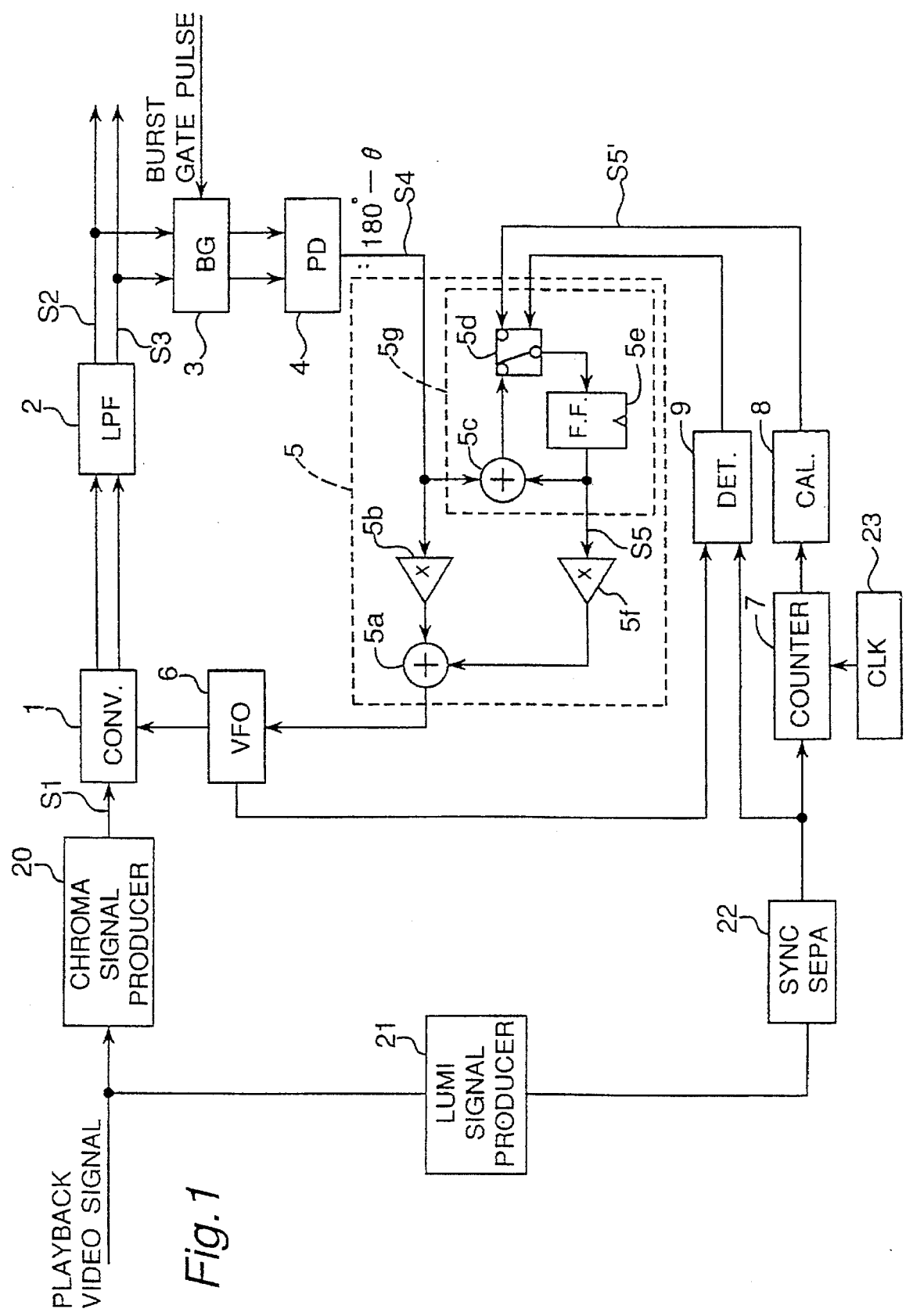
FIG. 1 is a block diagram showing the configuration of an automatic phase control apparatus according to the first embodiment of the invention.

The first embodiment of an automatic phase control apparatus according to the invention is described below with reference to the accompanying figures, of which FIG. 1 is a block diagram showing the configuration of an automatic phase control apparatus according to this embodiment.

Referring to FIG. 1, the automatic phase control loop ("APC loop") is formed by a chrominance signal producer 20 which has a low pass filter, a luminance signal producer 21 which has a high pass filter, and a horizontal sync (H sync) pulse separator 22. The APC loop further has a frequency converter 1, a low-pass filter 2, a burst gate 3, a phase difference detector 4, a loop filter 5, and a variable frequency oscillator 6.

The loop filter 5 is a secondary loop filter comprising an integrator 5g, multipliers 5b and 5f, and an adder 5a. The integrator 5g comprises an adder 5c, switch 5d, and D flip-flop 5e. Preferrably, adder 5a adds data from 5b and data from 5f, and further adds the sum of these two data with a predetermined constant value to effect the free run oscillation of oscillator 6.

According to the present invention, the APC loop further has a frequency asynchronous detector 9 which is for detecting the frequency asynchronization state and operating errors of the APC loop, a counter 7 and an calculator 8. These circuits 7, 8 and 9 form a circuit for correcting APC loop misoperation and frequency asynchronization.

The automatic phase control apparatus according to the present embodiment thus comprised operates as described below.

A playback video signal in digital form is applied to the chrominance signal producer 20 which then produces chrominance signal S1, such as shown in FIG. 4A, having a carrier wave frequency of 40 $f_H$ ($f_H$ represents a frequency of horizontal sync pulse) in the case of NTSC system, and 40.125 $f_H$ in the case of PAL system. The playback video signal is also applied to the luminance signal producer 21, which then produces luminance signal. Using the luminance signal, the synchronization separator 22 separates and produces H sync pulses having 1 H pulse period.

It is noted that the 1 H pulse period of the H sync pulses from synchronization separator 22 is not constant from the strict sense, because the playback signal of the VCR contains jitter, such as caused by the variations in the playback tape speed.

Using the sine wave having frequency 40 $f_H$ from variable frequency oscillator 6, frequency converter 1 converts and separates the chrominance signal S1 to R-Y base band signal and B-Y base band signal. To properly operate the frequency converter 1, it is necessary to match the frequency and phase of the carrier wave in chrominance signal S1 with the frequency and phase of the sine wave from the variable frequency oscillator 6. This matching is accomplished by the present invention as described below.

The R-Y base band signal and B-Y base band signal from frequency converter 1 are applied to the low pass filter 2 which removes unnecessary frequency components and demodulate the base band digital chrominance signal. The low pass filter 2 then produces R-Y signal S2 and B-Y signal S3, as shown in FIGS. 4B and 4C, respectively. As shown in FIG. 4B, R-Y signal S2 has a burst signal having amplitude Br. Similarly, as shown in FIG. 4C, B-Y signal S3 has a burst signal having amplitude −Bb. By the use of burst gate pulse, the burst signals are extracted at the burst gate 3. The extracted burst signals are applied to the phase difference detector 4 in which a phase θ of a combined burst signal is detected. As shown in FIG. 5, R-Y signal and B-Y signal have 90° phase difference, so that the combined burst signal is a vector sum of burst signals Br and −Bb.

The phase difference between the phase of the carrier wave in signal S1 and the phase of the sine wave from the variable frequency oscillator 6 can be detected by the phase of the combined burst signal. According to the NTSC system, the phase difference would be zero when the phase of the combined burst signal is 180°. Thus, the phase difference can be expressed by 180°−θ.

According to PAL system, the phase of the combined burst signal should be equal to 135° and 225° for the alternate lines to obtain zero phase difference between the phase of the carrier wave in signal S1 and the phase of the sine wave from the variable frequency oscillator 6. In this case, the phase difference can be expressed as 135°−$θ_a$ and 225°−$θ_b$ for the alternate lines. The average of the phase differences in two consecutive lines can be expressed as ½(135°−$θ_a$+225°−$θ_b$)=180°−½($θ_a$+$θ_b$).

In the case of NTSC system, the phase difference data 180°−θ is applied to the adder 5c and also to the multiplier 5b at which the phase difference data 180°−θ is multiplied by a predetermined coefficient. A similar thing can be said to the PAL system. The switch 5d is normally switched in the position shown in FIG. 1, so that the sum of the adder is fed to a data input of flip-flop 5e. The flip-flop 5e produces an integrated data which is returned back to adder 5c and also to multiplier 5f at which the integrated data is multiplied by a predetermined coefficient. The new phase difference data applied to adder 5c from phase difference detector 4 is added with the previously stored and integrated phase difference data from flip-flop 5e. Then, adder 5a adds the newly obtained phase difference data multiplied by a predetermined coefficient with the integrated phase difference data multiplied by a predetermined coefficient, and the sum signal is output as the control signal of the variable frequency oscillator 6.

The state in which the frequency and phase of the APC loop are synchronized to the carrier wave of the reproduced low-band converted color signal is considered below. In this state, the phase error signal output from the phase error detector 4 is zero, and the phase error proportional signal obtained by the coefficient multiplier 5b is also zero. The phase error integration signal is therefore supplied to the variable frequency oscillator 6 as a control signal equivalent to the difference of the oscillation frequency of the variable frequency oscillator 6 and the carrier frequency of the reproduced low-band converted color signal. More specifically, the output signal of the integrating circuit 5g controls the oscillation frequency of the variable frequency oscillator 6. As a result, it is possible to monitor the synchronization state of the APC loop frequency using the output signal of the integrating circuit 5g. In addition because the carrier frequency of the low-band converted color signal is 40 $f_H$ in the NTSC system and 40.125 $f_H$ in the PAL system, the oscillation frequency that is emitted by the variable frequency oscillator 6 in the normal synchronization state, and therefore the value that should be output by the integrating circuit 5g, can be known by determining the horizontal scanning frequency of the reproduced signal.

Figure 6A:
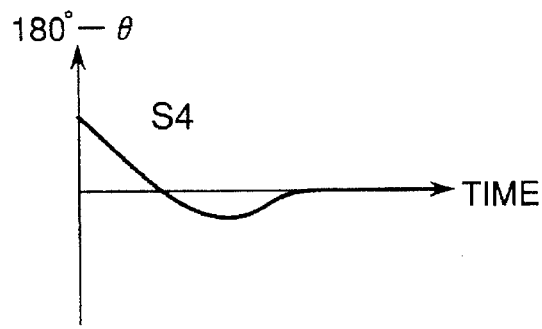
FIGS. 6A and 6B are wave form diagrams of signals obtained from the circuit of FIG. 1.
Figure 6B:
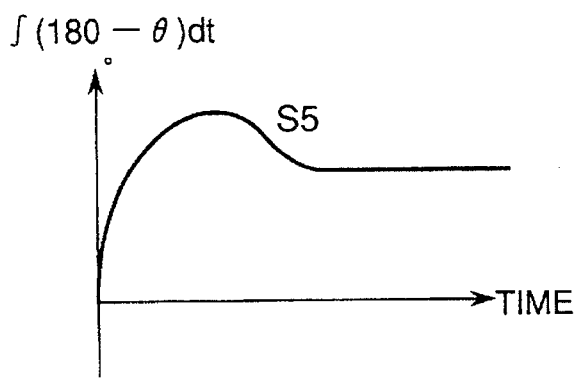

FIGS. 6A and 6B show an example of signals S4 and S5 during transient from asynchronous state to synchronous state.

Referring now to FIG. 2, a detail of the variable frequency oscillator 6 is shown which comprises an integrator 6b and a sine wave generator 6a. The integrator 6b integrates, after the variable frequency oscillator 6 becomes stable, the constant value data from adder 5a, and over flows after reaching a predetermined value. Thus, as shown in FIG. 3B, integrator 6b produces serrated signal at a frequency equal to 40 $f_H$. The serrated signal is applied to sine wave generator 6a at which the sine wave signal having frequency 40 $f_H$ is produced, as shown in FIG. 3A.

In the circuit described above, a problem arises when the operation of the above described feedback circuit is stabled to a condition called side lock. Under the side lock condition, the frequency of the carrier wave is 40 $f_H$, but the variable frequency oscillator 6 may produce sine wave of frequency 39 $f_H$ or 41 $f_H$, and yet no phase difference is detected at the phase difference detector 4. The circuits 7, 8 and 9 are provided to detect the side lock condition and to correct the variable frequency oscillator 6 to produce sine wave of frequency 40 $f_H$, as described below.

The integrator 6b integrates the constant signal from adder 5a and produces a gradually rising signal, as shown in FIG. 3B. In the preferred embodiment, the integration is done using the digital signal at predetermined sampling frequency which is much higher than frequency 40$f_H$. The integrated result is also given by a digital signal. In this case, as apparent to those skilled in the art, the MSB (most-significant bit) of the integrated result will be as shown in FIG. 3C such that the MSB changes from "0" to "1" only once during one integration cycle. After each integration cycle, all bits including MSB is reset to zero, ready for integrating the constant value for the next cycle. The integrator 6b is further described below.

The actual output signals from integrator 6b are discrete digital signals, but are shown in FIG. 3B as a continuous wave signal for simplicity. The integrator 6b outputs a sawtooth-shaped periodic wave because the circuit overflows when an upper limit determined by the output bit number of the integrator 6b is exceeded. This periodic wave corresponds to the phase of the oscillation signal output by the variable frequency oscillator 6, and one cycle corresponds to phase zero to phase $2\pi$. The MSB in the phase signal changes from 0 to 1 only once per cycle. For example, if the variable frequency oscillator 6 is oscillating at 40 $f_H$, the value of the MSB will change from 0 to 1 forty times during one horizontal scanning period. As a result, by counting the number of such changes between consecutive two H sync pulses, the oscillation frequency of the variable frequency oscillator 6 can be known. In addition, the value of the n-th bit below the MSB changes, from 0 to 1, $2^n$ times per cycle. Therefore, by counting the number of times the value of the lower bit changes from 0 to 1, the oscillation frequency of the variable frequency oscillator 6 can be determined with even better precision. Because the carrier frequency of the low-band converted chrominance signal is 40 $f_H$ and 40.125 $f_H$, respectively, in the NTSC and PAL systems as described above, it is possible to detect whether the APC loop is correctly synchronized to the carrier frequency of the reproduced low-band converted chrominance signal.

The MSB data of the integrated result is applied the frequency asynchronous detector 9.

Figure 7:
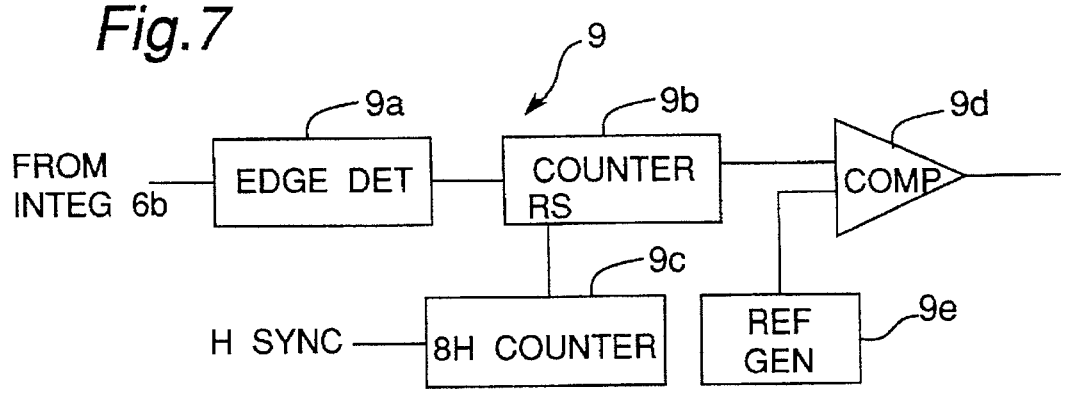
FIG. 7 is a block diagram showing a detail of a detector shown in FIG. 1.

Referring to FIG. 7, the frequency asynchronous detector 9 includes an edge detector 9a for detecting the leading edge (the edge at which the value is changed from "0" to "1") of the MSB data from the integrator 6b, a counter 9b for counting the detected edges, an 8 H counter 9c for counting 8 H period by the use of H sync pulse, and a comparator 9d for comparing the counted result with a predetermined reference value from a reference generator 9e. The predetermined reference value is 320 for the case of NTSC system, and 321 for the case of PAL system. In the case of NTSC system, the carrier wave should have 40 cycles in 1 H period. Thus, in 8 H period, the carrier wave should have 320 cycles. Similarly, in the case of PAL system the carrier wave should have 40.125 cycles in 1 H period. Thus, in 8 H period, the carrier wave should have 321 cycles. Comparator 9d produces a HIGH level signal, indicative of the side lock condition or any other asynchronous state, when the counted result in counter 9b is not equal to the reference value, but produces a LOW level signal when the counted result in counter 9b is equal to the reference value. The output of the frequency asynchronous detector 9 is applied to switch 5d for controlling the switching position, The frequency asynchronous detector 9 is used in association with counter 7 and calculator 8 as described below.

Referring back to FIG. 1, counter 7 receives H sync pulses and counts the time length of the 1 H period of the playback video signal using clock pulses (frequency $f_{CK}$) from a clock generator 23. As state before, the 1 H period of the playback video signal varies relatively to the tape speed. According to the preferred embodiment, counter 7 counts 8 H period and divides the counted result by eight to obtain an average of the 1 H period.

Calculator 8 calculates an expected integrated phase difference data S5' (hereinafter referred to as a calculated phase difference data S5') which, after being multiplied by the predetermined coefficient in multiplier 5f, will be necessary for the variable frequency oscillator 6 to generate sine wave having frequency 40 $f_H$.

The calculation carried out in calculator 8 is described below. It is noted that the parameters are defined such that: C is the counted result of counter 7; $f_U$ is the free running oscillation frequency of the variable frequency oscillator 6; $K_V$ is the frequency modulation sensitivity, which is the ratio between the input to the variable frequency oscillator 6 and the change in the oscillation frequency relative to the input; and $K_f$ is the coefficient of the coefficient multiplier 5$f$.

The frequency of the sync pulses from the playback video signal can be expressed as $f_{CK}/C$. The calculations as carried out in calculator 8 for obtaining the calculated phase difference data S5' are given below.

In the case of NTSC system, $$S5' = \frac{40 \cdot \frac{f_{CK}}{C} - f_v}{K_v \cdot K_f}$$

is calculated, and in the case of PAL system, $$S5' = \frac{40 \cdot 125 \cdot \frac{f_{CK}}{C} - f_v}{K_v \cdot K_f}$$

is calculated.

Note that the calculator 8 can be easily achieved by using a ROM in which the output-equivalent values S5' of the integrator 5$g$ for each count C are stored as data, and the count C is the address of the data in ROM.

In operation, when the frequency asynchronous detector 9 detects a side lock condition or any other asynchronous state, a HIGH level signal is produced from comparator 9$d$. Thus, switch 5$d$ is switched from the position shown in FIG. 1 to another position so that the input of the flip-flop 5$e$ is connected to output of the calculator 8. Thus, the calculated phase difference data S5' as calculated by calculator 8 is stored in flip-flop 5$e$ and is take out as a new calculated phase difference data S5. The new calculated phase difference data S5 is multiplied by the predetermined coefficient in multiplier 5$f$ and applied to variable frequency oscillator 6. Thus, the variable frequency oscillator 6 is reset to operate with the oscillation frequency correctly synchronized to the carrier frequency of the reproduced low-band converted chrominance signal. As a result, the synchronization frequency of an APC loop in a side locked or other operating error condition is instantaneously corrected.

In addition, an APC loop in the frequency synchronization process is immediately reset to the frequency synchronized state, and the time required for the frequency synchronization process is shortened. As a result, transient response characteristics can be improved without deteriorating the steady characteristics of the APC loop.

When, the variable frequency oscillator 6 starts to produce sine waves having frequency 40 $f_H$, the frequency asynchronous detector 9 detects that the side lock condition is recovered. Thus, a LOW level signal is produced from comparator 9$d$. Thus, switch 5$d$ is switched back to the position shown in FIG. 1 to start integrating, if any, the phase difference data S4 from phase difference detector 4 over the data already stored in flip-flop 5$e$.

As described hereinabove, it is therefore possible to instantaneously correct APC loop operating errors by providing the automatic phase control apparatus with a counter 7 for counting the H sync pulse interval period; a calculator 8 for calculating the value equivalent to the integrator output from the count returned by the counter 7; a switch 5$d$ in the integrator 5$g$; and a detector 9 for detecting the frequency synchronization process state and side locking or other operating error conditions of the APC loop from the oscillation frequency of the variable frequency oscillator 6; and configuring the automatic phase control apparatus in such a way that the output of the calculator 8 is selectively used as the input of the integrator 5$g$ based on the control signal output by the detector 9.

This embodiment of the invention also improves transient response characteristics, and therefore provides good image quality even in special reproduction modes, because the time required for frequency synchronization of the APC loop is shortened.

Figure 8:
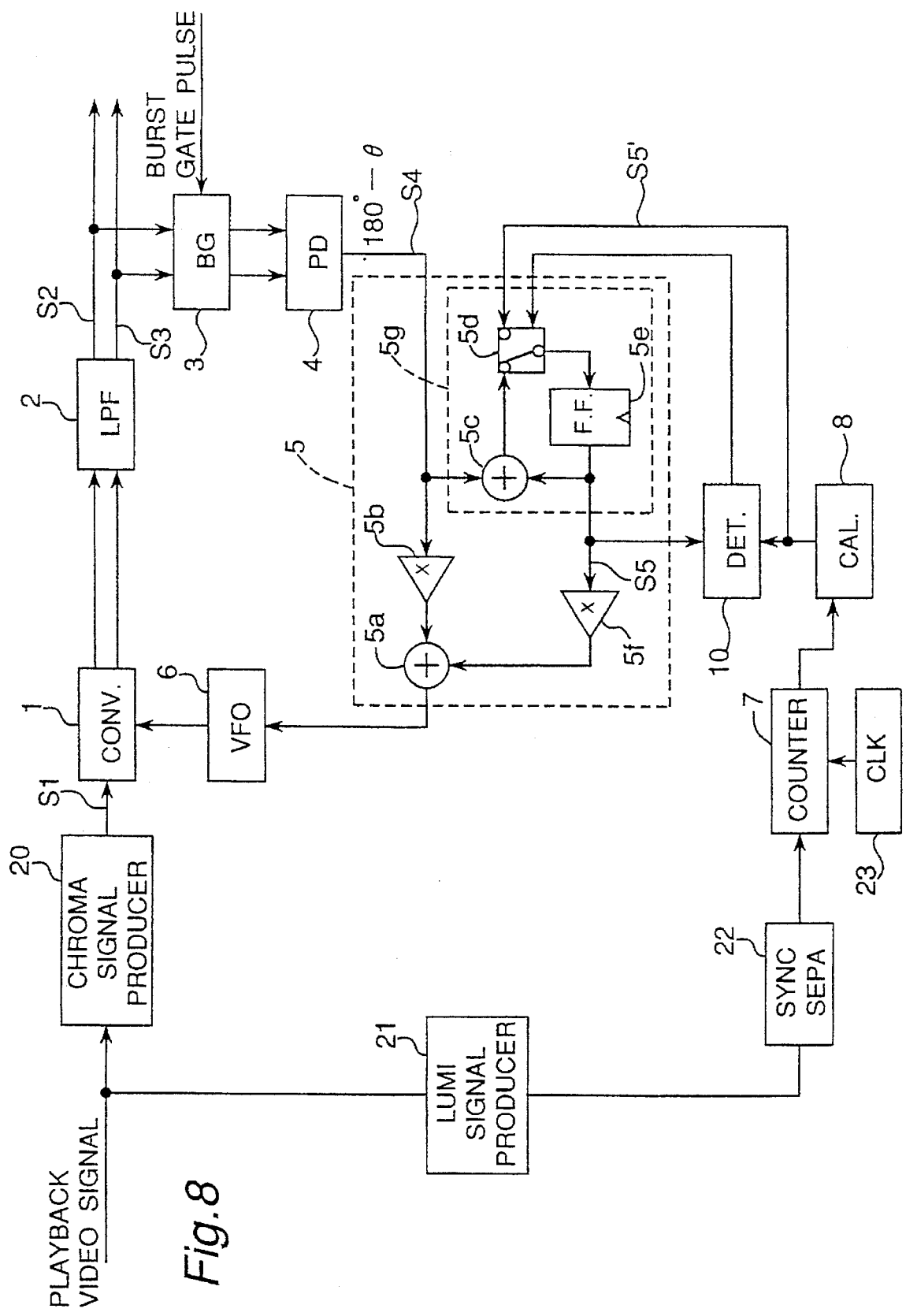
FIG. 8 is a block diagram showing the configuration of an automatic phase control apparatus according to the second embodiment of the invention.

Referring to FIG. 8 a block diagram of an automatic phase control apparatus according to a second embodiment of the invention is shown. The second embodiment differs from the first in that a different type of frequency asynchronous detector 10 is used in place of the detector 9 of the first embodiment for detecting the frequency synchronization process and operating errors in the APC loop. In FIG. 8, components that are the same in the first and second embodiments are identified by the same reference numerals.

Figure 9:
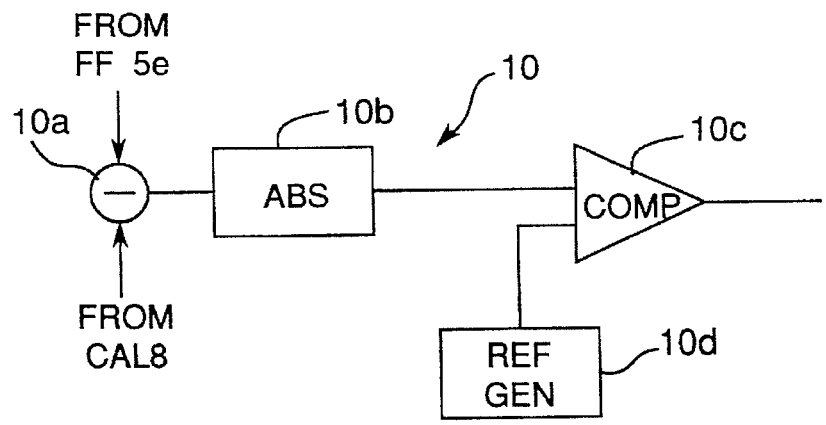
FIG. 9 is a block diagram showing a detail of a detector shown in FIG. 8.

Referring to FIG. 9, a detail of the frequency asynchronous detector 10 is shown. Frequency asynchronous detector 10, which is for detecting the frequency synchronization state, comprises a subtractor 10$a$, an absolute circuit 10$b$, a comparator 10$c$ and a reference generator 10$d$. The subtractor 10$a$ calculates a difference between the integrated phase difference data S5 from flip-flop 5$e$ and the calculated phase difference data S5' from calculator 8. The absolute circuit 10$b$ takes an absolute value of the difference from the subtractor 10$a$. Reference generator 10$d$ is previously stored with a reference value which represents a limit of the deviation from the expected integrated phase difference data S5'.

If the integrated phase difference data S5 is relatively close to the expected integrated phase difference data S5', it is understood that the variable frequency oscillator 6 is producing the sine wave signal of proper frequency, such as 40 $f_H$ in the case NTSC system. In this case, in is understood that the side lock condition or any other error state is not taking place. Thus, comparator 10$c$ produces a LOW level signal to maintain the switch 5$d$ in the position shown in FIG. 8.

If on the other hand, the integrated phase difference data S5 differs from the calculated phase difference data S5' by an amount greater than the reference value of the reference generator 10$d$, it is plausible that the variable frequency oscillator 6 is producing the sine wave signal of improper frequency. Thus, comparator 10$c$ produces a HIGH level signal to change the switching position of the switch 5$d$.

The operation of the automatic phase control apparatus according to the second embodiment thus comprised is described below, particularly in connection with frequency asynchronous detector 10.

The frequency asynchronous detector 10 detects whether the APC loop is correctly synchronized to the carrier frequency of the reproduced low-band converted chrominance signal by comparing the output signal of the integrator 5$g$ with the output signal of the calculator 8. When the APC loop is in the correct frequency synchronization state, the value of the output signal from the calculator 8 will be the value that should be held by the integrator 5$g$. If these values differ greatly, the detector 10 detects a frequency asynchronization or operating error in the APC loop, and thus controls the switch 5$d$ to select the output signal of the calculator 8. As a result, the output signal of the calculator 8 is set as the output of the integrator 5$g$, the output of the loop filter 5 is immediately reset to the value of the correct frequency synchronization state, and the variable frequency oscillator 6 therefore operates with the oscillation frequency correctly synchronized to the carrier frequency of the reproduced low-band converted chrominance signal.

It is therefore possible, as in the first embodiment above, to correct side locking and other operating errors, and to improve the transient characteristics without deteriorating the steady characteristics.

By using the frequency asynchronous detector 10 that compares the output of the loop filter 5 with the output of the calculator 8 to detect the frequency synchronization state of the APC loop as described in the second embodiment above, it is possible to detect operating errors and the frequency synchronization process of the APC loop by a simple circuit configuration.

In the first and second embodiments, the frequency asynchronous detector 9 or 10 can be considered as a deviation detector for detecting a deviation of the input data to the variable frequency control 6 with respect to the expected input data.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An automatic phase control apparatus comprising:

a horizontal sync separator for producing a horizontal sync signal separated from a reproduced luminance signal;

an automatic phase control loop of which a closed loop transfer function takes a secondary loop form, and which comprises:
(a) a variable frequency oscillator; and
(b) a loop filter comprising an integrating means;

calculation means for calculating an expected value that would be produced from said integrating means using a unit period determined by said horizontal sync signal, said expected value provided to said integrating means when a detected frequency synchronization state of said automatic phase control loop is out of a predetermined range; and detection means for detecting said detected frequency synchronization state of said automatic phase control loop.

2. An automatic phase control apparatus according to claim 1, wherein said detection means detects frequency synchronization error in the automatic phase control loop by counting a frequency of a signal produced from said variable frequency oscillator.

3. An automatic phase control apparatus according to claim 1, wherein said detection means detects frequency synchronization error in the automatic phase control loop by comparing an output value of the integrating means with the calculated value.

4. An automatic phase control apparatus comprising:

chrominance signal producer means for extracting a chrominance signal from a playback video signal and for producing a carrier signal further modulated by said chrominance signal to produce a modulated chrominance signal;

variable frequency oscillator means for producing a wave signal having a frequency determined by an input frequency control data;

calculation means for calculating an expected frequency control data;

frequency converter means, coupled to said chrominance signal producer means and said variable frequency oscillator means, for demodulating the modulated chrominance signal to remove the carrier signal using said wave signal;

phase difference detection means, coupled to said frequency converter means, for detecting a phase difference between said wave signal and said carrier signal;

deviation detection means, coupled to said calculation means and said variable frequency oscillator means, for detecting a deviation of said frequency control data with respect to said expected frequency control data and producing a deviation detection signal;

frequency control data generating means, coupled to said deviation detection means and said calculation means, for generating said frequency control data in accordance with said deviation detection signal when said deviation is less than a predetermined amount, and in accordance with said expected frequency control data when said deviation is greater than said predetermined amount.

5. An automatic phase control apparatus as claimed in claim 4, wherein said calculation means comprises:

a horizontal sync pulse detector for detecting horizontal sync pulses from the playback video signal;

a counter for counting a pulse interval period of the detected horizontal sync pulses; and a calculator for calculating said expected frequency control data based on said detected pulse interval period.

6. An automatic phase control apparatus as claimed in claim 4, wherein said deviation detection means comprises:

a horizontal sync pulse detector for detecting horizontal sync pulses from the playback video signal;

counting means for counting a number of cycles of said wave signal per a unit period determined by said horizontal sync pulses; and a comparator for comparing said counted number of cycles with a preselected number of cycles.

7. An automatic phase control apparatus as claimed in claim 4, wherein said deviation detection means comprises;

a difference detector for detecting a difference between said expected frequency control data and an integrated data obtained by integrating said detected phase difference; and a comparator for comparing said difference with a preselected difference.

8. An automatic phase control apparatus as claimed in claim 4, wherein said frequency control data generating means comprises an integrator for integrating said phase difference.

* * * * *

UNITED STATES PATENT AND TRADE MARK OFFICE
CERTIFICATE OF CORRECTION

PATENT NO.   : 5,631,708
DATED        : May 20, 1997
INVENTOR(S)  : Nakagaki

It is certified that error appears in the above-identified patent and that said Letters Patent is hereby corrected as shown below:

On the cover page, item [56] References Cited, Foreign Patent Documents, delete "40219396   8/1990   Japan" and insert --2-219396   9/1990   Japan--.

Signed and Sealed this

Second Day of June, 1998

Attest:

BRUCE LEHMAN

Attesting Officer

Commissioner of Patents and Trademarks